(12) United States Patent
Ireland et al.

(10) Patent No.: US 6,806,576 B2
(45) Date of Patent: Oct. 19, 2004

(54) PASSIVATION INTEGRITY IMPROVEMENTS

(75) Inventors: Philip J. Ireland, Nampa, ID (US); James E. Green, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/411,171

(22) Filed: Apr. 9, 2003

(65) Prior Publication Data

US 2003/0205782 A1 Nov. 6, 2003

Related U.S. Application Data

(62) Division of application No. 10/007,471, filed on Nov. 2, 2001, now Pat. No. 6,563,219, which is a division of application No. 09/389,658, filed on Sep. 2, 1999, now Pat. No. 6,358,862.

(51) Int. Cl.[7] .......................... H01L 23/48; H01L 23/52
(52) U.S. Cl. .................. 257/758; 257/635; 257/640
(58) Field of Search ................ 257/758, 635, 257/640, 637, 639

(56) References Cited

U.S. PATENT DOCUMENTS

| | | | |
|---|---|---|---|
| 5,372,969 A | 12/1994 | Moslehi | 437/195 |
| 5,523,616 A | 6/1996 | Den | 257/637 |
| 5,644,153 A | 7/1997 | Keller | 257/324 |
| 5,759,913 A * | 6/1998 | Fulford et al. | 438/624 |
| 5,814,555 A * | 9/1998 | Bandyopadhyay et al. | 438/619 |
| 5,880,018 A | 3/1999 | Boeck et al. | 438/619 |
| 5,880,026 A | 3/1999 | Xing et al. | 438/688 |
| 5,903,041 A | 5/1999 | La Fleur et al. | 257/530 |
| 5,985,767 A | 11/1999 | Roberts et al. | 438/720 |
| 6,037,249 A | 3/2000 | Chiang et al. | 438/619 |
| 6,051,509 A | 4/2000 | Tsuchiaku | 438/758 R |
| 6,107,183 A | 8/2000 | Sandhu et al. | 438/622 |
| 6,141,365 A | 10/2000 | Bowler | 372/46 |
| 6,150,190 A | 11/2000 | Stankus et al. | 438/72 |
| 6,160,316 A | 12/2000 | Gardner et al. | 257/773 |
| 6,208,015 B1 | 3/2001 | Bandyopadhyay et al. | 257/635 |
| 6,376,911 B1 | 4/2002 | Ryan et al. | 257/752 |
| 6,563,219 B2 * | 5/2003 | Ireland et al. | 257/758 |

* cited by examiner

Primary Examiner—S. V. Clark

(57) ABSTRACT

An exemplary implementation of the invention is a process for forming passivation protection on a semiconductor assembly by the steps of: forming a layer of oxide over patterned metal lines having sidewalls; forming a first passivation layer of silicon nitride over the layer of oxide such that the first passivation layer of silicon nitride resides along the sidewalls of metal lines and pinches off a gap between the metal lines; performing a facet etch to remove material from the edges of the first passivation layer of silicon nitride and re-deposits some of removed material across a pinch-off junction; forming a second passivation layer of silicon nitride on the first passivation layer of silicon nitride.

5 Claims, 2 Drawing Sheets

PASSIVATION INTEGRITY IMPROVEMENTS

This application is a divisional to U.S. patent application Ser. No. 10/007,471, filed Nov. 2, 2001 now U.S. Pat. No. 6,563,219, which is a divisional to U.S. patent application Ser. No. 09/389,658, filed Sep. 2, 1999, now issued as U.S. Pat. No. 6,358,862.

FIELD OF THE INVENTION

This invention relates to semiconductor fabrication processing and more particularly to a method for improving passivation integrity for semiconductor devices, such as random access memories.

BACKGROUND OF THE INVENTION

In semiconductor fabrication, after patterning the final metal layer, such as aluminum (Al), into metal lines, a passivation layer is deposited over the entire top surface of the semiconductor assembly. The passivation layer is an insulating, protective layer that prevents mechanical and chemical damage during assembly and packaging of individual semiconductor devices. The passivation layer must possess gettering or barrier properties that enable the film to prevent sodium ions and other fast-diffusing metallic contaminants from reaching the underlying metal lines. In general, the thicker the passivation layer the better, since a thicker layer will provide better protection. However, because the thicker chemical vapor deposited (CVD) films, especially silicon nitride films, have high stress and a higher tendency to crack, there is normally an upper limit to the thickness.

Silicon nitride has been used as passivation material because it provides an impermeable barrier to moisture and mobile ion impurities (e.g., sodium) and also forms a durable coat that protects the device against scratching. However, because the passivation layer must be deposited over metal films, only plasma enhanced chemical vapor deposited (PECVD) nitride films may be used for this application since a PECVD nitride film is deposited at approximately 400° C. (a low deposition temperature that is less than the melting point of the underlying metal, typically no greater than 450° C., must be used in order to avoid reflowing and thus thinning of the metal). Unfortunately, PECVD nitride films normally exhibit a high mechanical stress, which can cause cracks in the film during subsequent heating steps.

FIG. 1 depicts a conventional fabrication process used to form typical passivation layers for a semiconductor device. In FIG. 1, a first tetra-ethyl-ortho-silicate (TEOS) layer 12 has been formed over metal lines 11 and then facet etched. A second TEOS layer 13 is formed on first TEOS layer 12. As shown, TEOS layer 13 pinches off the gap between metal lines 11. Then, a nitride passivation layer 14 is deposited onto TEOS layer 13. Because nitride layer 14 conforms to the contour of TEOS layer 13, stress point 15 forms directly above the pinch off line. Stress caused by such forces as subsequent heating can cause a fracture or crack in nitride layer 14 due to stress point 15. Obviously, any crack in nitride layer 14 will render the passivation qualities less than optimal, as a crack will allow the penetration of mobile ions and moisture into the underlying structures of the semiconductor device.

The present invention discloses a method to reduce cracking of passivation films by reducing stress and thus improving the barrier capability of the passivation film to mobiles ion impurities and moisture.

SUMMARY OF THE INVENTION

An exemplary implementation of the present invention comprises passivation protection for semiconductor assemblies and a method to form them. The general concept of the present invention is to provide passivation protection using partially conformal passivation layers so that the resulting structure will be resistance to stress caused by expansion and contraction of neighboring structures or layers of material in order to avoid cracking while providing passivation protection that is an excellent mobile ion barrier to ionized alkali metal atoms, such as sodium ($Na^+$), potassium ($K^+$), and lithium ($Li^+$).

In an exemplary implementation, passivation protection is formed by placing a layer of oxide over patterned metal lines having sidewalls. Next, a first passivation layer of silicon nitride is formed on the layer of oxide such that the first passivation layer of silicon nitride resides along the sidewalls of metal lines and preferably, pinches itself off to form a gap between the metal lines. This method develops a passivation structure wherein the passivation layer of silicon nitride is resistance to stress caused by the expansion and contraction of neighboring structures or layers of material. Next, a facet etch is performed to remove material from the edges of the first passivation layer of silicon nitride. Finally, a second passivation layer of silicon nitride is formed on the first passivation layer of silicon nitride, wherein the contour of the second passivation layer of silicon nitride is such that the second passivation layer of silicon nitride is resistance to stress caused by the expansion and contraction of neighboring structures or layers of material.

DETAILED DESCRIPTION OF THE INVENTION

Figure 1:
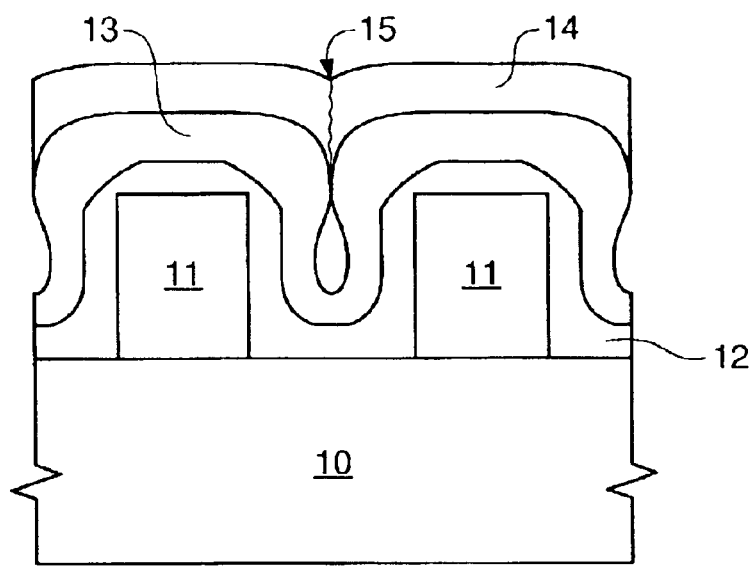
FIG. 1 is a cross-sectional view depicting a semiconductor assembly after the formation of passivation layers using conventional fabrication techniques.
Figure 2:
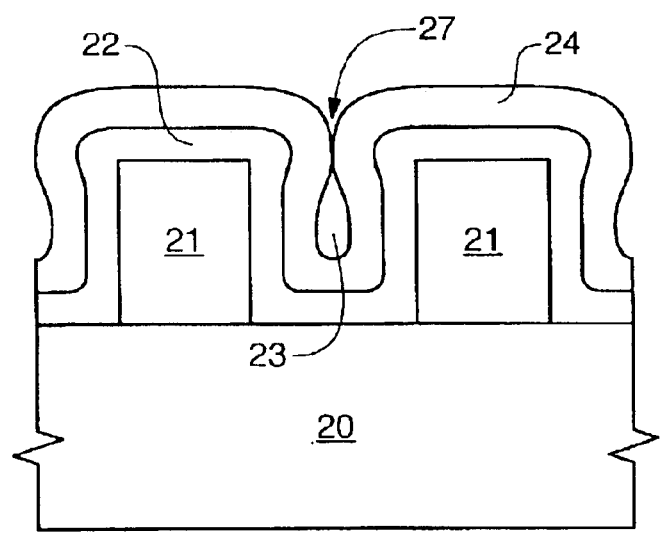
FIG. 2 is a cross-sectional view depicting a semiconductor assembly after the formation of metal lines covered with a layer of oxide and a layer of passivation material.
Figure 3:
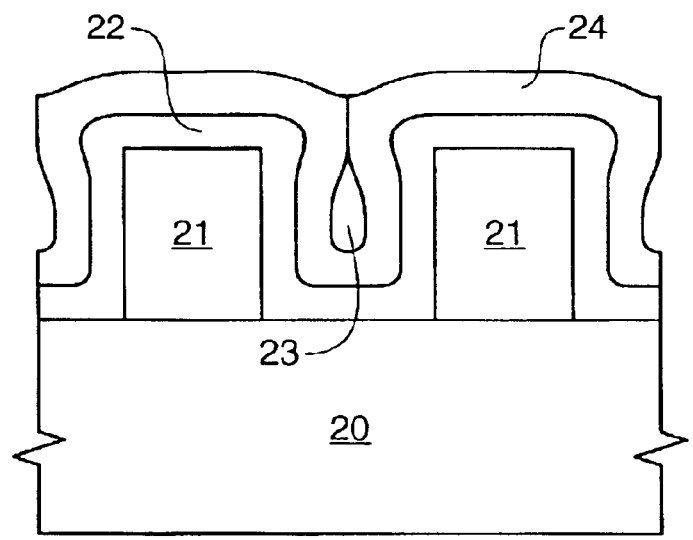
FIG. 3 is a cross-sectional view of the structure of FIG. 2 taken after a facet etch is performed on the layer of passivation material.
Figure 4:
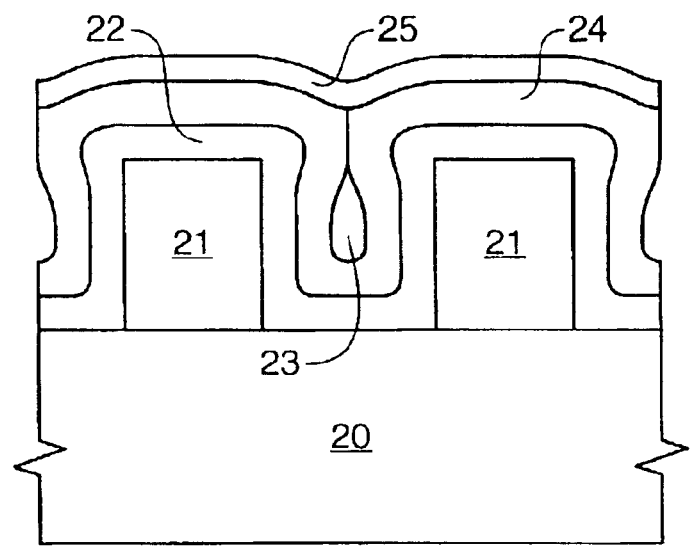
FIG. 4 is a cross-sectional view of the structure of FIG. 3 taken after a deposition step to form a second layer of passivation material.

An exemplary implementation of the present invention is directed to a process for forming improving passivation integrity in a semiconductor device as depicted in FIGS. 2–4.

Referring now to FIG. 2, semiconductor assembly 20 is prepared for the processing steps of the present invention. Semiconductor assembly 20 is intended to represent structures and layers of material that have been previously fabricated. For example, in an exemplary device such as a DRAM memory, semiconductor assembly 20 could comprise active field effect transistors, additional patterned conductive lines and capacitors that combine to form a plurality of storage cells.

During wafer preparation, conductive metal lines 21 are deposited and patterned onto semiconductor assembly 20 by conventional metalization techniques. First layer 22, such as tetra-ethyl-ortho-silicate (TEOS) is formed over metal lines 21. Layer 22 helps reduce stress that may be exerted on metal lines 21 and ideally, the edges of layer 22 will become thicker due to bread-loaf buildup that typically occurs during deposition. This bread-loaf buildup will lead to the formation an air gap between neighboring metal lines 21 that is pinched off later in the process. Though the broad-loaf buildup is desirable, it is also necessary that apposing edges of layer 22 be separated by a space that is wide enough to allow a subsequently deposited layer to follow both the horizontal and vertical contour of layer 22. The dielectric material used to form layer 22 may be an oxide or an nitride, oxide is preferred as oxide tends to form a more significant bread-loaf buildup during deposition than does nitride. The bread-loaf buildup of layer 22 enhances the ideal condition that a subsequently deposited layer will pinch itself off at seam 27, thus leading to the formation of the above mentioned gap. The importance of this gap will be discussed later in the description of the invention.

Next, passivation layer 24 is formed over the top of layer 22 so that layer 24 follows both the horizontal and vertical contour of layer 22. Though not required, it is preferred that passivation layer 24 will also pinch itself off (at seam 27) during deposition, as described above, and leave an air gap 23 between metal lines 21. Ideally, passivation layer 24 should meet several requirements in order to function satisfactorily as a passivation layer.

First, a passivation layer should be an excellent mobile ion barrier, in that ionized alkali metal atoms, such as sodium ($Na^+$), potassium ($K^+$), and lithium ($Li^+$), will not readily diffuse through the passivation layer. If mobile ions (or mobile impurities) penetrate a passivation layer they will then continue to diffuse into the underlying structures. As the mobile ions diffuse and then congregate in an active area of an active transistor, the charge of the mobile ions can change the transistor's threshold voltage (vt.). Once this occurs, the active transistor's operating characteristics are degraded, which can cause defective operation of a device.

Second, and equally important, a passivation layer should protect the underlying metal lines from moisture in order to avoid corrosion and corroded metal lines lead to premature device failures. Silicon nitride ($Si_3N_4$) is the preferred choice for passivation layer 24, as silicon nitride provides an impermeable barrier to moisture and mobile impurities and also forms a durable coat that protects the semiconductor assembly against scratching. However, silicon nitride is prone to cracking, a condition that cannot be tolerated in a passivation layer. Also, because nitride possesses high dielectric constant characteristics, a concern is that the nitride passivation has the potential to cause higher capacitive coupling between metal lines, an undesirable trait.

A main focus of the present invention is to provide a highly reliable passivation layer that meets the requirements, discussed previously, and yet one that is not prone to cracking, nor one that increases capacitive coupling between underlying metal lines.

Referring again to FIG. 2, as mentioned previously, passivation layer 24 is formed such that desired air gap 23 exists between metal lines 21. Though air gap 23 is desired, it is not required. However, having air gap 23 present will help reduce the interactive capacitive coupling that may develop between generally parallel metal lines 21.

A main concern of the present invention is that passivation layer 24 be formed in such a manner to help reduce the formation of stress points that are common with layers of material deposited over three-dimensional structures. With the reduction of such stress points, the passivation layer will not be as prone to cracking due to the fact that any force exerted on passivation layer 24, caused by subsequent heating, will be more uniform and thus avoid putting pressure on any stress points that may be present.

Referring now to FIG. 3, a high-pressure facet etch is performed on passivation layer 24 so that the corners are reduced (i.e., the bread-loaf buildup) and there is no longer a disjointed region on which to deposit a subsequent material. During the high-pressure facet etch, material is removed from the broad-loafed edges of layer 24 and re-deposited in the crevice created at the junction where layer 24 pinches itself off. If this crevice is allowed to remain and a subsequent layer was deposited over it, an undesirable stress point would develop at the junction. By using a facet etch to reduce these edges and to re-deposit some material into the crevice, a potential stress point is virtually eliminated or at minimum, reduced by creating a generally smooth varying contour. The length of time the facet etch is performed can be determined by experimentation to obtain a non-disjointed contour of the surface of layer 24 at the pinch-off junction. A typical high-pressure facet etch can be use for this step, such as the various facet etching methods described in U.S. Pat. No. 5,644,153, assigned to the assignee of the present invention and herein incorporated by reference.

Referring now to FIG. 4, a second passivation layer 25 is formed on first passivation layer 24. Silicon nitride is once again preferred and it is further preferred that the silicon nitride material deposited for layers 24 and 25 are the same type of silicon nitride materials and particularly, silicon nitride layers which are not rich in silicon. Silicon rich nitrides tend to have higher tensile stress, which makes the silicon rich nitride film more prone to cracking than non-silicon rich nitride films. Due to the earlier facet etch that reduced the corners of passivation layer 24, layer 25 has a smooth contour as it runs across the pinch-off junction or seam 27 of layer 24. At pinch-off junction 27, the facet etch effectively smoothes the upper surface of layer 24 by minimizing the height difference between seam 27 and the upper most extent of layer 24. The smooth contour of layer 25 further reduces a potential stress point and thus provides a passivation layer that is not prone to cracking and yet is effective in acting as a barrier to mobile impurities and moisture.

The semiconductor assembly is then completed in accordance with fabrication processes known to those skilled in the art.

It is to be understood that although the present invention has been described with reference to several preferred embodiments, various modifications, known to those skilled in the art may be made to the process steps presented herein without departing from the invention as recited in the several claims appended hereto.

What is claimed is:

1. A mobile ion barrier on a semiconductor assembly, said mobile ion barrier comprising:

a layer of oxide over patterned metal lines having sidewalls;

a layer of silicon nitride overlying said layer of oxide in such a manner that said layer of silicon nitride resides along said sidewalls of said metal lines and pinches off a gap between said metal lines.

2. The mobile ion barrier as recited in claim 1, wherein said gap between said metal lines comprises an air gap.

3. A mobile ion barrier on a semiconductor assembly, said mobile ion barrier comprising:

a layer of oxide over patterned metal lines having sidewalls;

a layer of silicon nitride having faceted edges, said layer of silicon nitride overlying said layer of oxide in a conformal manner to resides along said sidewalls of said metal lines such that a pinched off gap is formed between said metal lines; and a second layer of silicon nitride overlying said first layer of silicon nitride.

4. The mobile ion barrier as recited in claim 3, wherein said gap between said metal lines comprises an air gap.

5. A semiconductor assembly having mobile ion barrier, said mobile ion barrier comprising:

a layer of oxide over patterned metal lines having sidewalls;

a first layer of silicon nitride having faceted edges, said layer of silicon nitride overlying said layer of oxide in a conformal manner to reside along said sidewalls of said metal lines such that a pinched off air gap is formed between said metal lines; and a second layer of silicon nitride overlying said first layer of silicon nitride.

* * * * *